United States Patent
Xu

(10) Patent No.: US 12,156,349 B2
(45) Date of Patent: Nov. 26, 2024

(54) DISPLAY PANEL AND ELECTRONIC DEVICE

(71) Applicant: Wuhan China Star Optoelectronics Technology Co., Ltd., Wuhan (CN)

(72) Inventor: Zuoyuan Xu, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/785,433

(22) PCT Filed: May 19, 2022

(86) PCT No.: PCT/CN2022/093841
§ 371 (c)(1),
(2) Date: Jun. 15, 2022

(87) PCT Pub. No.: WO2023/216294
PCT Pub. Date: Nov. 16, 2023

(65) Prior Publication Data
US 2024/0196549 A1    Jun. 13, 2024

(30) Foreign Application Priority Data
May 9, 2022   (CN) .......................... 202210500837.7

(51) Int. Cl.
*H05K 5/00* (2006.01)
*H05K 5/02* (2006.01)

(52) U.S. Cl.
CPC ...................................... *H05K 5/02* (2013.01)

(58) Field of Classification Search
CPC ...................................................... H05K 5/02
(Continued)

(56) References Cited

U.S. PATENT DOCUMENTS

2013/0328840 A1* 12/2013 Fujikawa ................. G09G 3/36
345/204
2015/0286084 A1* 10/2015 Yoshida ............ G02F 1/133345
257/43
(Continued)

FOREIGN PATENT DOCUMENTS

| CN | 107170366 A | 9/2017 |
|---|---|---|
| CN | 108986672 A | 12/2018 |

(Continued)

OTHER PUBLICATIONS

International Search Report in International application No. PCT/CN2022/093841, mailed on Dec. 21, 2022.
(Continued)

*Primary Examiner* — Zhengfu J Feng
(74) *Attorney, Agent, or Firm* — Nathan & Associates; Menachem Nathan

(57) ABSTRACT

A display panel and an electronic device including the display panel are provided. The display panel includes a binding region and a signal bus line region. The signal bus line region includes a first region defined aligned to the binding region and a second region located on two opposite sides of the first region. By reducing a distance between sides away from each other of a first and a last of the signal bus lines in the first region, a distance between the binding region and the display region is reduced, thereby reducing a width of a lower bezel of the display panel.

20 Claims, 3 Drawing Sheets

(58) Field of Classification Search
USPC .......................................................... 361/807
See application file for complete search history.

(56) References Cited

U.S. PATENT DOCUMENTS

| | | | | |
|---|---|---|---|---|
| 2016/0232837 A1* | 8/2016 | Lee | .................... | G09G 3/3275 |
| 2017/0288008 A1* | 10/2017 | Kim | .................... | H10K 59/1315 |
| 2017/0365217 A1* | 12/2017 | An | .................... | G09G 3/3266 |
| 2021/0158736 A1* | 5/2021 | Kwak | .................... | G09G 3/20 |

FOREIGN PATENT DOCUMENTS

| | | |
|---|---|---|
| CN | 109212852 A | 1/2019 |
| CN | 110412802 A | 11/2019 |
| CN | 110579917 A | 12/2019 |
| CN | 210323695 U | 4/2020 |
| CN | 111383554 A | 7/2020 |
| CN | 111564111 A | 8/2020 |
| CN | 111650788 A | 9/2020 |
| CN | 114035387 A | 2/2022 |
| WO | 2021164359 A1 | 8/2021 |

OTHER PUBLICATIONS

Written Opinion of the International Search Authority in International application No. PCT/CN2022/093841, mailed on Dec. 21, 2022.

Chinese Office Action issued in corresponding Chinese Patent Application No. 202210500837.7 dated Dec. 12, 2022, pp. 1-6.

\* cited by examiner

DISPLAY PANEL AND ELECTRONIC DEVICE

BACKGROUND OF INVENTION

Field of Invention

The present invention relates to the field of display technology, and particularly to a display panel and an electronic device.

Description of Prior Art

With development of display technology and continuous changes of panel market requirements, requirements for screen-to-body ratios of electronic devices such as mobile phones, computers, and televisions are increasingly higher, so that narrow bezels or even bezel-free designs of the display panels get more and more attention by the industry.

In structures of current display panels, due to signal bus line regions being defined in the non-display regions below display regions, widths of each signal bus line in the signal bus line region being kept consistent, and spacing between each signal bus line being designed large; the signal bus line regions are made to occupy a large area in the non-display regions, resulting in excessively wide lower bezels of the display panels, which is not conducive to the realization of panel designs of a narrow bezel or even bezel-free.

In summary, the current display panels have the problem that the signal bus line regions occupy a lot of space, which leads to the excessive width of the lower bezels of the display panels. Therefore, a display panel and an electronic device need to be provided to solve the defect.

SUMMARY OF INVENTION

Embodiments of the present application provide a display panel and an electronic device configured to reduce a space occupied by a signal bus line region, thereby reducing a width of a lower bezel of the display panel.

One embodiment of the present application provides a display panel, including a display region, a binding region defined on a side of the display region, and a signal bus line region located between the display region and the binding region. The display panel further includes:

- a plurality of signal bus lines disposed in the signal bus line region, wherein the plurality of signal bus lines extend along a first direction and are spaced apart in a second direction, the first direction is different from the second direction.

Wherein, the signal bus line region includes a first region defined aligned to the binding region and a second region located on two opposite sides of the first region, and a distance between sides away from each other of a first and a last of the plurality of signal bus lines in the first region is smaller than a distance between sides away from each other of a first and a last of the plurality of signal bus lines in the second region.

According to one embodiment of the present application, the distance between the sides away from each other of the first and the last of the plurality of signal bus lines in the second region gradually decreases from an end away from the first region to an end close to the first region.

According to one embodiment of the present application, the signal bus lines include first portions located in the first region and second portions located in the second region and connected to the first portions, a distance between a side of one of the first portions and a same side of an adjacent one of the first portions is less than a distance between a side of one of the second portions and a same side of an adjacent one of the second portions.

According to one embodiment of the present application, the distance between the side of the one of the second portions and the same side of the adjacent one of the second portions gradually decreases from an end away from the first portions to an end close to the first portions.

According to one embodiment of the present application, a width of the second portions in the second direction gradually decreases from the end away from the first portions to the end close to the first portions.

According to one embodiment of the present application, distances between any two adjacent second portions are equal, and the distances between any two adjacent second portions are greater than or equal to distances between two adjacent first portions.

According to one embodiment of the present application, a distance between any two adjacent second portions gradually decreases from the end away from the first portions to the end close to the first portions.

According to one embodiment of the present application, the display panel includes a demultiplexing circuit region, and the demultiplexing circuit region is defined between the display region and the signal bus line region. The display panel further includes:

- a plurality of first fan-out wirings including first segments led out from the binding region along the second direction, second segments connected to the first segments and extending along a direction different from the first direction and the second direction, and third segments connected to the second segments and extending to the demultiplexing circuit region through the first region along the second direction; and
- a plurality of second fan-out wirings including fourth segments led out from the binding region along the second direction, fifth segments connected to the fourth segments and extending along a direction different from the first direction and the second direction, and sixth segments connected to the fifth segments and extending to the demultiplexing circuit region through the second region along the second direction;
- wherein an included angle between the second segments and the second direction is less than an included angle between the fifth segments and the second direction, and ends of the sixth segments connected to the fifth segments are located on a side of the signal bus line region away from the demultiplexing circuit region.

According to one embodiment of the present application, the ends of the sixth segments of at least two of the plurality of second fan-out wirings located on any side of the first region and connected to the fifth segments are located in a same inclined straight line, and an extending direction of the inclined straight line is different from the first direction and the second direction.

According to one embodiment of the present application, a distance between the ends of the sixth segments connected to the fifth segments and the demultiplexing circuit region gradually increases from the end close to the first region to the end away from the first region.

According to one embodiment of the present application, a distance between a side of one of the plurality of second fan-out wirings and a same side of an adjacent one of the plurality of second fan-out wirings is greater than a distance between a side of one of the plurality of first fan-out wirings and a same side of an adjacent one of the plurality of first fan-out wirings.

According to one embodiment of the present application, the distance between the side of the one of the plurality of second fan-out wirings and the same side of the adjacent one of the plurality of second fan-out wirings gradually decreases from the end away from the first portions to the end close to the first portions.

One embodiment of the present application further provides an electronic device. The electronic device includes a display panel. The display panel includes a display region, a binding region defined on a side of the display region, and a signal bus line region located between the display region and the binding region. The display panel further includes:

a plurality of signal bus lines disposed in the signal bus line region, wherein the plurality of signal bus lines extend along a first direction and are spaced apart in a second direction, and the first direction is different from the second direction.

Wherein, the signal bus line region includes a first region defined aligned to the binding region and a second region located on two opposite sides of the first region, and a distance between sides away from each other of a first and a last of the plurality of signal bus lines in the first region is smaller than a distance between sides away from each other of a first and a last of the plurality of signal bus lines in the second region.

According to one embodiment of the present application, the distance between the sides away from each other of the first and the last of the plurality of signal bus lines in the second region gradually decreases from an end away from the first region to an end close to the first region.

According to one embodiment of the present application, the signal bus lines include first portions located in the first region and second portions located in the second region and connected to the first portions, and a distance between a side of one of the first portions and a same side of an adjacent one of the first portions is less than a distance between a side of one of the second portions and a same side of an adjacent one of the second portions.

According to one embodiment of the present application, the distance between the side of the one of the second portions and the same side of the adjacent one of the second portions gradually decreases from an end away from the first portions to an end close to the first portions.

According to one embodiment of the present application, a width of the second portions in the second direction gradually decreases from the end away from the first portions to the end close to the first portions.

According to one embodiment of the present application, distances between any two adjacent second portions are equal, and the distances between any two adjacent second portions are greater than or equal to distances between two adjacent first portions.

According to one embodiment of the present application, a distance between any two adjacent second portions gradually decreases from the end away from the first portions to the end close to the first portions.

According to one embodiment of the present application, the display panel includes a demultiplexing circuit region, and the demultiplexing circuit region is defined between the display region and the signal bus line region. The display panel further includes:

a plurality of first fan-out wirings including first segments led out from the binding region along the second direction, second segments connected to the first segments and extending along a direction different from the first direction and the second direction, and third segments connected to the second segments and extending to the demultiplexing circuit region through the first region along the second direction; and a plurality of second fan-out wirings including fourth segments led out from the binding region along the second direction, fifth segments connected to the fourth segments and extending along a direction different from the first direction and the second direction, and sixth segments connected to the fifth segments and extending to the demultiplexing circuit region through the second region along the second direction; and wherein an included angle between the second segments and the second direction is less than an included angle between the fifth segments and the second direction, and ends of the sixth segments connected to the fifth segments are located on a side of the signal bus line region away from the demultiplexing circuit region.

Beneficial effects of embodiments of the present disclosure: The embodiments of the present application provide a display panel and an electronic device. The electronic device includes the display panel. The display panel includes a display region, a binding region defined on a side of the display region, and a signal bus line region located between the display region and the binding region. The display panel includes a driving chip disposed in the binding region, and a plurality of signal bus lines disposed in the signal bus line region. The plurality of signal bus lines extend along a first direction and are spaced apart in a second direction. The first direction is different from the second direction. The signal bus line region includes a first region defined aligned to the binding region and a second region located on two opposite sides of the first region. By reducing a distance between sides away from each other of a first and a last of the signal bus lines in the first region, a distance between the binding region and the display region is reduced, thereby reducing a width of a lower bezel of the display panel.

DESCRIPTION OF DRAWINGS

To more clearly illustrate embodiments or the technical solutions of the prior art, the accompanying figures required for illustrating embodiments or the technical solutions of the prior art will be described in brief. Obviously, the accompanying figures described below are only part of the embodiments of the present disclosure, from which those skilled in the art can derive further figures without making any inventive efforts.

DETAILED DESCRIPTION OF EMBODIMENTS

The descriptions of embodiments below refer to accompanying drawings in order to illustrate certain embodiments which the present disclosure can implement. The directional terms of which the present disclosure mentions, for example, "top", "bottom", "upper", "lower", "front", "rear", "left", "right", "inside", "outside", "side", etc., are only refer to directions of the accompanying figures. Therefore, the used directional terms are for illustrating and understanding the present disclosure, but not for limiting the present disclosure. In the figures, units with similar structures are used same labels to indicate.

The present disclosure will be further described in detail below in combination with the drawings and specific embodiments.

Figure 1:
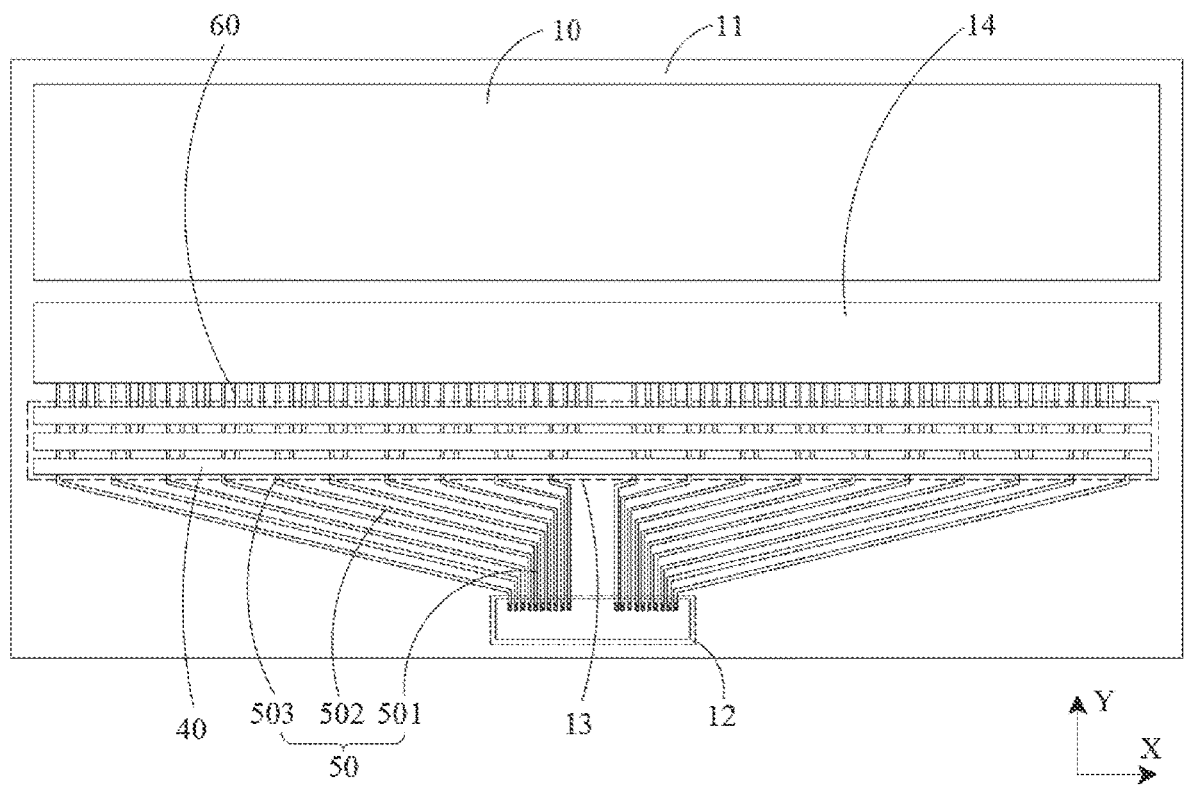
FIG. 1 is a structural schematic diagram of a current display panel.

Illustrated in FIG. 1 is a structural schematic diagram of a current display panel. In a structures of a current display panel, a signal bus line region 13 is generally defined in a non-display region 11 below a display region 10. Due to widths of each signal bus line 40 in the signal bus line region 13 being kept consistent and spacing between each signal bus line 40 being designed large, the signal bus line region 13 is made to occupy a large area in the non-display region 11, resulting in an excessively wide lower bezel of the display panels, which is not conducive to realization of panel designs of a narrow bezel or even bezel-free.

Figure 2:
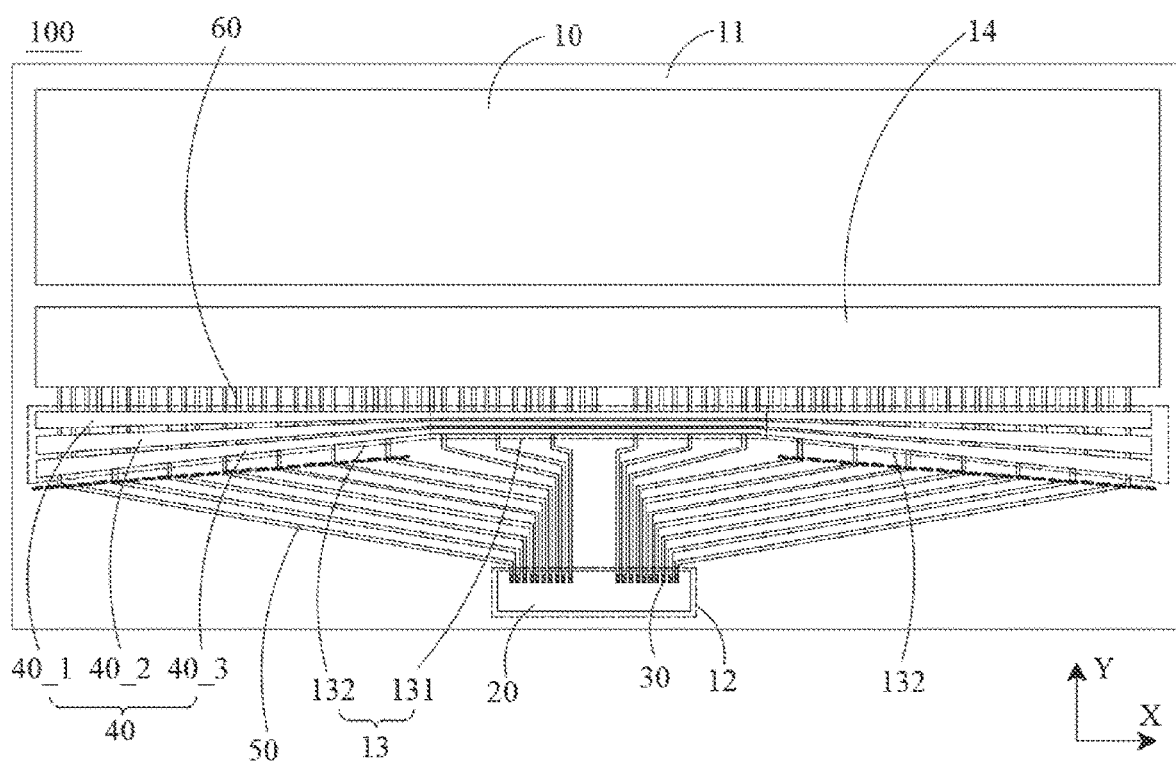
FIG. 2 is a schematic diagram of a planar structure of a display panel provided by one embodiment of the present application.

Embodiments of the present application provide a display panel configured to reduce the space occupied by the signal bus line region, thereby reducing the width of the lower bezel of the display panel. Illustrated in FIG. 2 is a schematic diagram of a planar structure of a display panel provided by one embodiment of the present application. The display panel 100 includes a display region 10 and a non-display region 11 defined on a periphery of the display region 10.

The non-display region 11 includes a binding region 12 defined on a side of the display region 10, and a signal bus line region 13 located between the display region 10 and the binding region 12.

The display panel 100 further includes a driving chip 20. The driving chip 20 is disposed in the binding region 12. A plurality of binding terminals 30 are disposed in the binding region 12. The driving chip 20 is electrically connected to the binding chips 30.

The display panel 100 further includes a plurality of signal bus lines 40. The signal bus lines 40 are disposed in the signal bus line region 13. The plurality of signal bus lines 40 extend along a first direction X and are spaced apart in a second direction Y. The first direction X is different from the second direction Y.

In one embodiment of the present application, taking the planar schematic diagram illustrated in FIG. 2 as an example, the first direction X is a horizontal direction, the second direction Y is a vertical direction, and the first direction X is perpendicular to the second direction Y.

The display panel further includes a demultiplexing circuit region 14. The demultiplexing circuit region 14 is defined between the display region 10 and the signal bus line region 13. The display panel includes a demultiplexing circuit. The demultiplexing circuit is disposed in the demultiplexing circuit region 14.

The display panel further includes a plurality of fan-out wirings 50. An end of the fan-out wirings 50 is electrically connected to the corresponding binding terminals 30 in the binding region 12. Another end of the fan-out wirings 50 extends to the demultiplexing circuit region 14 through the signal bus line region 13 and is connected to the corresponding demultiplexing circuit.

The fan-out wirings 50 and the signal bus lines 40 are disposed in different layers. An orthogonal projection of the signal bus lines 40 in a thickness direction of the display panel overlaps with an orthogonal projection of the fan-out wirings 50 in the thickness direction of the display panel.

The signal bus line region 13 includes a first region 131 defined aligned to the binding region 12 and a second region 132 located on two opposite sides of the first region 131. From the second region 132 of a side, the signal bus lines 40 can sequentially pass through the first region 131 and the second region 132 located on another side along the first direction X.

Figure 3:
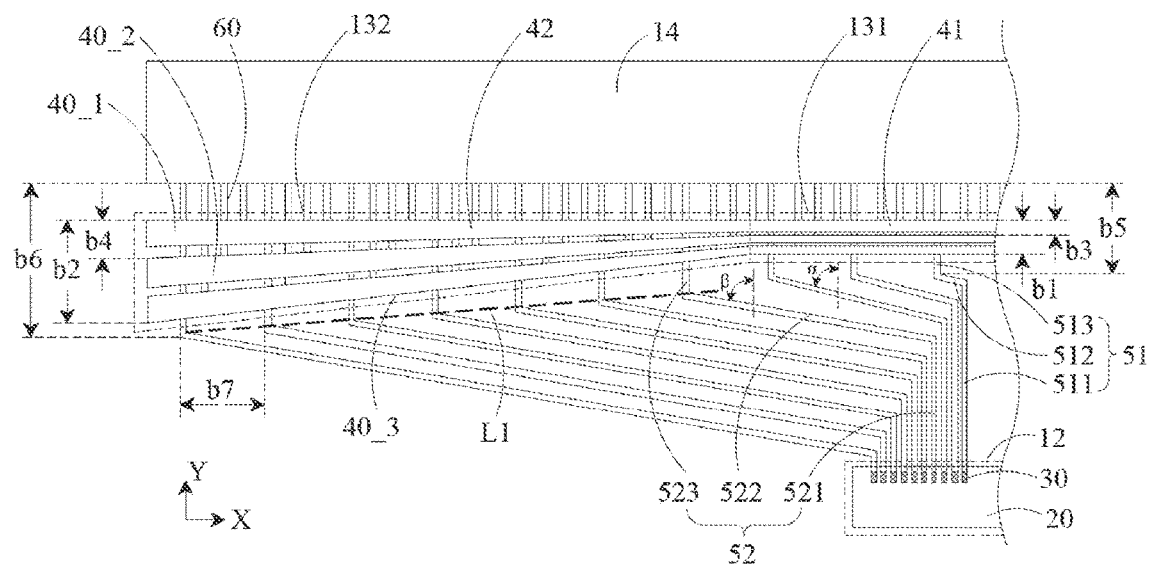
FIG. 3 is an enlarged schematic diagram of a binding region provided by one embodiment of the present application.

In one embodiment of the present application, illustrated in FIG. 3 is an enlarged schematic diagram of a binding region provided by one embodiment of the present application. A distance b1 between sides away from each other of a first and a last of the signal bus lines 40 in the first region 131 in the second direction Y is smaller than a distance b2 between sides away from each other of a first and a last of the signal bus lines 40 in the second region 132 in the second direction Y.

With reference to FIG. 2 and FIG. 3, the driving chip 20 is disposed directly below the first region 131, a width of a lower bezel of the display panel 100 relates to the distance b1 between the sides away from each other of the first and the last of the signal bus lines 40 in the first region 131 in the signal bus line region 13 in the second direction Y, a width of the binding region 12 in the second direction Y, and a width between the first region 131 and the binding region 12 in the second direction Y. Increasing the distance b2 between the sides away from each other of the first and the last of the signal bus lines 40 in the second region 132 will not affect the width of the lower bezel of the display panel 100.

Figure 4:
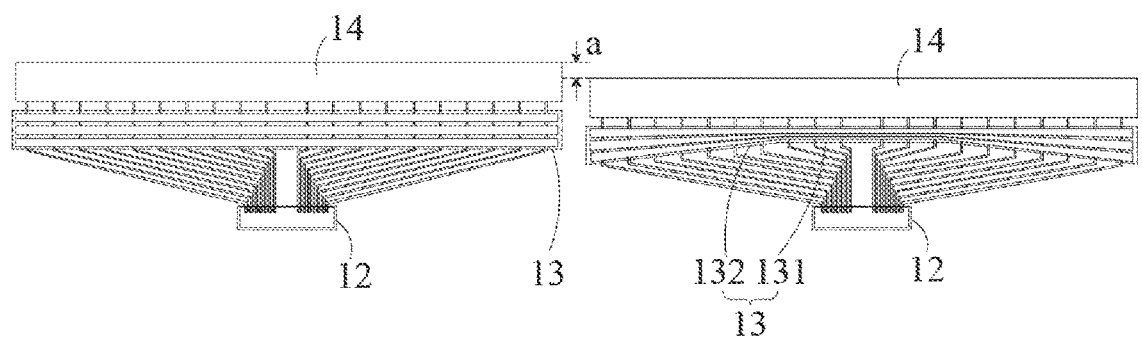
FIG. 4 is a comparison schematic diagram of the current display panel and the display panel provided by one embodiment of the present application.

Illustrated in FIG. 4 is a comparison schematic diagram of the current display panel and the display panel provided by one embodiment of the present application. Compared to the current display panel illustrated on the left side of FIG. 4, the width of the first region 131 in the signal bus lines of the display panel provided by the embodiments of the present application can be smaller than the width of the signal bus line region 13 in the current display panel. Hence, by reducing the distance b1 between the sides away from each other of the first and the last of the signal bus lines 40 in the first region 131 in the signal bus line region 13 in the second direction Y, a distance between the binding region 12 and the demultiplexing circuit region 14 can be reduced, thereby being able to reduce a certain width a of the lower bezel of the display panel 100.

Furthermore, the distance b2 between the sides away from each other of the first and the last of the plurality of signal bus lines in the second region 132 in the second direction Y gradually decreases from an end away from the first region 131 to an end close to the first region 131.

It should be noted that the distance between the sides away from each other of the first and the last of the signal bus lines in the signal bus line region 13 in the second direction Y refers to a sum of the width of each of the signal bus lines 40 in the signal bus line region 13 and the distance between each of the signal bus lines 40. By reducing the width of each signal bus line 40 in the first region 131, and/or by reducing the distance between each signal bus line 40 in the first region 131, the distance b1 between the sides away from each other of the first and the last of the signal bus lines in the first region 131 in the second direction Y is allowed to be reduced at a certain extent. By increasing the width of each signal bus line 40 in the second region 132, and/or by increasing the distance between each signal bus line 40 in the second region 132, the distance b2 between the sides away from each other of the first and the last of the signal bus lines in the second region 132 in the second direction Y is allowed to be increased at a certain extent.

In one embodiment of the present application, the signal bus lines 40 include first portions 41 located in the first region 131 and second portions 42 located in the second region 132 and connected to the first portions 41, and a distance between a side of the first portion 41 and a same side of an adjacent first portion 41 is less than a distance between a side of the second portion 42 and a same side of an adjacent second portion 42.

With reference to FIG. 2 and FIG. 3, in one embodiment of the present application, the signal bus lines 40 include signal bus lines 40_1, 40_2, and 40_3 spaced apart from each other along the second direction Y. Taking the signal bus line 40_1 as an example, the signal bus line 40_1 includes the first portion 41 located in the first region 131 and the second portion 42 of the second region 132 located on two sides of the first region 131, and the second portion 42 is connected to the first portion 41. The structures of other signal bus lines in the signal bus line region 13 can refer to the structure of the signal bus line 40_1, redundant description will not be mentioned herein again.

It should be noted that FIG. 2 and FIG. 3 only schematically show arrangement manners and structural features of the signal bus lines 40 in the signal bus line region 13, and a number of signal bus lines 40 in the signal bus line region 13 in FIG. 1 and FIG. 2 does not represent a number in practical application.

Furthermore, the distance between the side of the second portion 42 and the same side of the second portion 42 gradually decreases from the end away from the first portions 41 to the end close to the first portions 41.

In one embodiment of the present application, taking the signal bus lines 40_1 and 40_2 as an example, a distance b4 between an upper side of the second portion 42 of the signal bus line 40_1 and an upper side of the second portion 42 of the signal bus line 40_2 is a sum of a width of the second portion 42 of the signal bus line 40_1 and a distance between a lower side of the second portion 42 of the signal bus line 40_1 and an upper side of the second portion 42 of the signal bus line 40_2.

Furthermore, a distance between a side of the second portion 42 and a same side of an adjacent second portion 42 is greater than a distance between a side of the first portion 41 and a same side of an adjacent first portion 41.

In one embodiment of the present application, taking the signal bus lines 40_1 and 40_2 as an example, a distance b3 between an upper side of the first portion 41 of the signal bus line 40_1 and an upper side of the first portion 41 of the signal bus line 40_2 is less than the distance b4 between the upper side of the second portion 42 of the signal bus line 40_1 and the upper side of the second portion 42 of the signal bus line 40_2.

The distance b3 between the upper side of the second portion 42 of the signal bus line 40_1 and the upper side of the second portion 42 of the signal bus line 40_2 gradually decreases from the end away from the first portion 41 to the end close to the first portion 41. After accumulation of the plurality of signal bus lines 40, the width of the second region 132 in the second direction Y is allowed to gradually decrease from the end away from the first region 131 to the end close to the first region 131, and the width of the first region 131 is allowed to be smaller than the width of the second region 132. Hence, the width between the binding region 12 and the signal bus line region 13 is reduced, thereby effectively reducing the width of the lower bezel of the display panel.

In one embodiment of the present application, a width of the second portions 42 in the second direction gradually decreases from the end away from the first portions 41 to the end close to the first portions 41, and the width of the first portion 41 in the second direction Y is equal everywhere.

As illustrated in FIG. 3, taking the signal bus lines 40_1 and 40_2 as an example, the signal bus line 40_1 is the one farthest from the binding region 12, the first portion 41 of the signal bus line 40_1 is a straight line segment parallel to the first direction X, and the width of the first portion 41 in the second direction Y is equal everywhere. The width of the second portion 42 of the signal bus line 40_1 in the second direction Y gradually decreases from the end away from the first portion 41 to the end close to the first portion 41, and a lower side of the second portion 42 is an inclined straight line segment intersecting with the first direction X, meanwhile, the width of the second portion 42 in the second direction Y is greater than the width of the first portion 41 in the second direction Y.

The first portion 41 of the signal bus line 40_2 is a straight line segment parallel to the first direction X, and the width of the second portion 42 of the signal bus line 40_2 gradually decreases from the end away from the first portion 41 to the end close to the first portion 41, and an upper side and a lower side of the second portion 42 are inclined straight line segments intersecting with the first direction X. The structure of other signal bus lines 40 below the signal bus line 40_2 can refer to the structure of the signal bus line 40_2, redundant description will not be mentioned herein again. In this way, an overall width of the first region 131 can be reduced by reducing the width of each first portion 41 in the first region 131, thereby reducing the width of the lower bezel of the display panel 100. Meanwhile, by increasing the width of the second portion 42 in the second region 132, impedance of each signal bus line 40 is kept unchanged or within a preset range, thereby preventing the impedance of the signal bus line 40 from increasing due to decrement of the width of the first portion 41.

In one of the embodiments, distances between any two adjacent second portions 42 are equal, and the distances between any two adjacent second portions 42 are greater than or equal to distances between two adjacent first portions 41.

Specifically, taking the signal bus lines 40_1 and 40_2 as an example, while the second portions 42 of the signal bus lines 40_1 and 40_2 gradually decrease from the end away from the first portions 41 to the end close to the first portions 41, the distance between the first portion 41 of the signal bus line 40_1 and the first portion 41 of the signal bus line 40_2 is equal everywhere at the same time, and the distance between the second portion 42 of the signal bus line 40_1 and the second portion 42 of the signal bus line 40_2 is also equal everywhere. Furthermore, the distance between two adjacent second portions 42 is greater than the distance between two adjacent first portions 41.

In one of the embodiments, a distance between any two adjacent second portions 42 gradually decreases from the end away from the first portions 41 to the end close to the first portions 41, the distance between two adjacent second portions 42 is greater than the distance between two adjacent first portions 41, and the distance between any two adjacent first portions 41 are equal everywhere.

Specifically, please refer to FIG. 3, taking the signal bus lines 40_1 and 40_2 as an example, while the second portions 42 of the signal bus lines 40_1 and 40_2 gradually decrease from the end away from the first portions 41 to the end close to the first portions 41, the distance between the first portion 41 of the signal bus line 40_1 and the first portion 41 of the signal bus line 40_2 is equal everywhere at the same time, and the distance between the second portion 42 of the signal bus line 40_1 and the second portion 42 of the signal bus line 40_2 gradually decreases from the end away from the first portions 41 to the end close to the first portions 41. In this way, the distance between the side of the second portion 42 and the same side of the adjacent second portion 42 is allowed to be represented in a gradually decrement trend, thereby allowing to decrease the width of the first region 131 in the second direction Y. Meanwhile, the closer the distance between adjacent signal bus lines 40 is, the lager the parasitic capacitance is. By increasing the distance between the adjacent second portions 42 located in the second region 132, the parasitic capacitance of the signal bus lines 40 can be effectively reduced, and increment of a resistor-capacitor (RC) load of the signal bus lines 40 incurred by increment of the parasitic capacitance of the signal bus lines 40 due to reduction of the distance between the adjacent first portions 41 in the first region 131 is prevented.

In one of the embodiments, the width of the second portion 42 in the second direction Y is equal everywhere, a distance between any two adjacent second portions 42 gradually decreases from the end away from the first portions 41 to the end close to the first portions 41, and the distance between two adjacent second portions 42 is greater than the distance between two adjacent first portions 41.

Specifically, taking the signal bus lines 40_1 and 40_2 as an example, the widths of the second portion 42 of the signal bus line 40_1 in the second direction Y are all equal, and the width of the first portion 41 of the signal bus line 40_1 in the second direction Y can be equal to the width of the second portion 42 in the second direction Y, or the width of the first portion 41 of the signal bus line 40_1 in the second direction Y can also be smaller than the width of the second portion 42 in the second direction Y. The distance between the second portions 42 of the signal bus line 40_1 and the second portion 42 of the signal bus line 40_2 gradually decreases from the end away from the first portions 41 to the end close to the first portions 41. The distance between the second portion 42 of the signal bus line 40_1 and the second portion 42 of the signal bus line 40_2 is greater than the distance between the first portion 41 of the signal bus line 40_1 and the first portion 41 of the signal bus line 40_2. In this way, the distance between the adjacent first portions 41 can be made to be smaller than the distance between adjacent second portions 42, so that the distance between the adjacent second portions 42 is made to be in a gradually decreasing trend. In this way, the width of the first region 131 in the second direction Y can also be reduced.

In one embodiment of the present application, the signal bus line 40 can be the demultiplexing signal bus line, the signal bus line 40 can be connected to a control terminal of the demultiplexing circuit, the fan-out wiring 50 can be connected to an input terminal of the demultiplexing circuit, and an output terminal of the demultiplexing circuit can be connected to a corresponding data signal line in the display region 10.

In practical applications, the signal bus line 40 is not limited to the demultiplexing signal bus line in the aforesaid embodiments. The signal bus line 40 can also be a cell test bus line or a common electrode signal bus line. For example, when the signal bus line 40 is the common electrode signal bus line, the signal bus line region 13 can be disposed between the demultiplexing circuit region 14 and the display region 10.

As illustrated in FIG. 3, the plurality of fan-out wirings 50 include a plurality of first fan-out wirings 51. The first fan-out wirings 51 include first segments 511 led out from the binding region 12 along the second direction, second segments 512 connected to the first segments 511 and extending along a direction different from the first direction X and the second direction Y, and third segments 513 connected to the second segments 512 and extending to the demultiplexing circuit region 14 through the first region 131 along the second direction Y.

The fan-out wirings 50 further include a plurality of second fan-out wirings 52. The second fan-out wirings 52 include fourth segments 521 led out from the binding region 12 along the second direction Y, fifth segments 522 connected to the fourth segments 521 and extending along a direction different from the first direction X and the second direction Y, and sixth segments 523 connected to the fifth segments 522 and extending to the demultiplexing circuit region 14 through the second region 132 along the second direction Y.

Furthermore, both the second segments 512 and the fifth segments 522 are located on a side of the signal bus lines 40 away from the demultiplexing circuit region 14, and an included angle between the second segments 512 and the second direction Y is less than an included angle between the fifth segments 522 and the second direction Y.

As illustrated in FIG. 3, taking the first fan-out wiring 51 and the second fan-out wiring 52 marked in the figure as an example, the first segment 511 of the first fan-out wiring 51 is led out from the binding region 12 along the second direction Y, an end of the second segment 512 is connected to the first segment 511, another end of the second segment 512 extends toward the first region 131 in an inclined direction different from the first direction X and the second direction Y, and the second segments 512 of each of the first fan-out wiring 51 are all disposed on the side of the signal bus line region 13 away from the demultiplexing circuit region 14.

The third segment 513 is connected to another end of the second segment 512, extends to the demultiplexing circuit region 14 through the first region 131 along the second direction Y, and overlaps with the first portion 41 of the plurality of signal bus lines 40 in the first region 131 in a thickness direction of the display panel. Ends of each of the third segments 513 connected to the second segments 512 are on a same straight line parallel to the first direction X and are disposed on a side of the signal bus line region 13 away from the demultiplexing circuit region 14. The fourth segment 521 of the second fan-out wiring 52 is led out from the binding region 12 along the second direction Y. An end of the fifth segment 522 is connected to the fourth segment 521. Another end of the fifth segment 522 extends toward the second region 132 in an inclined direction different from the first direction X and the second direction Y. In one same second region 132, the fifth segments 522 of each of the second fan-out wiring 52 are all disposed on the side of the signal bus line region 13 away from the demultiplexing circuit region 14.

The sixth segment 523 is connected to another end of the fifth segment 522, extends to the demultiplexing circuit region through the second region 132 along the second direction Y, and overlaps with the second portion 42 of the plurality of signal bus lines in the second region 132 in the thickness direction of the display panel. Ends of the sixth segments 523 connected to the fifth segments 522 are all disposed on a side of the signal bus line region 13 away from the demultiplexing circuit region 14.

The second segments 512 of the plurality of first fan-out wirings 51 are disposed in parallel and spaced apart from each other. An included angle between the second segment 512 of the first fan-out wiring 51 and the second direction Y is α. The fifth segments 522 of the plurality of second fan-out wirings 52 are disposed in parallel and spaced apart from each other. An included angle between the fifth segment 522 of the second fan-out wiring 52 and the second direction Y is β. The included angle α is less than the included angle β.

The display panel can further include a plurality of signal wirings 60 extending along the second direction Y. An end of the signal wirings 60 can be connected to the corresponding signal bus lines 40. Another end of the signal wirings 60 can be connected to the corresponding demultiplexing circuit in the demultiplexing circuit region 14. The signal wirings 60 and the signal bus lines 40 can be disposed in different film layers. The signal wirings 60 can be connected to the signal bus lines 40 through via holes between the different film layers. The signal wirings 60 and the fan-out wirings 50 can be disposed in a same layer.

It should be noted that in related art illustrated in FIG. 1, the fan-out wirings 50 can include a first vertical section 501, an inclined section 502, and a second vertical section 503 connected in sequence. The first vertical section 501 and the second vertical section 503 both extend along the second direction Y. The inclined section 502 extends in a direction different from the first direction X and the second direction Y. The inclined section 502 is disposed on a side of the signal bus lines 40 away from the demultiplexing circuit region 14. Ends of the second vertical section 503 of each of the fan-out wirings 50 connected to the inclined section 502 are disposed on a same straight line parallel to the first direction X.

With reference to FIG. 1 to FIG. 3, if the wiring manner of the fan-out wirings 50 in the related art illustrated in FIG. 1 is adopted in both the first fan-out wiring 51 and the second fan-out wiring 52 in the embodiments of the present application, the end of the sixth segment 523 connected to the fifth segment 522 in the second fan-out wiring 52 and the end of the third segment 513 connected to the second segment 512 in the first fan-out wiring 51 are located in a same straight line parallel to the first direction X. As the signal wirings 60 are disposed in the same layer as the first fan-out wirings 51 and the second fan-out wirings 52, and the length of the plurality of signal wirings 60 corresponding to the second region 132 gradually increases from the side close to the first region 131 to the side away from the first area 131, when the signal wirings 60 reach a certain length, they can intersect with the fifth segments 522 inclinedly disposed in the second fan-out wirings 52, resulting in appearance of short circuit.

By increasing the included angle β between the fifth segment 522 of the second fan-out wirings 52 and the second direction Y, the included angle β is made to be larger than the included angle α between the second segment 512 of the first fan-out wiring 51 and the second direction Y. Hence, inclination extent of the fifth segment 522 is reduced, so that the ends of the fifth segment 522 connected to the sixth segment 523 can all be disposed on the side of the signal bus line region 13 away from the demultiplexing circuit region 14. In this way, intersection between the fifth segment 522 of the second fan-out wiring 52 and the signal wiring 60 is prevented, thereby being able to prevent the short circuit between the second fan-out wirings 52 and the signal wirings 60.

In one of the embodiments, from the side close to the first region 131 to the side away from the first region 131, the distance b2 between the sides away from each other of the first and the last of the signal bus lines 40 in the second region 132 gradually increase. The length of the signal wirings 60 increases as the distance b2 increases, and a distance b6 between the end of the sixth segment 523 connected to the fifth segment 522 and the demultiplexing circuit region 14 also gradually increases, thereby preventing intersection from appearing between the fifth segment 522 and the signal wiring 60.

In one of the embodiments, a distance b5 between the end of the second segment 512 connected to the third segment 513 and the demultiplexing circuit region 14 is less than the distance b6 between the end of the fifth segment 522 connected to the sixth segment 523 and the demultiplexing circuit region 14.

Furthermore, the ends of the sixth segments 523 of at least two second fan-out wirings 52 located on any side of the first region 131 and connected to the fifth segments 522 are located in a same inclined straight line.

In one of the embodiments, as illustrated in FIG. 3, taking the plurality of second fan-out wirings 52 located on the left side of the first region 131 as an example, the ends of the sixth segment 523 of the plurality of second fan-out wirings 52 connected to the fifth segment 522 are all in the same inclined straight line L1. An extending direction of the inclined straight line L1 is different from the first direction X and the second direction Y. The signal bus lines 40 can be disposed on a side of the inclined straight line L1 close to the demultiplexing circuit region 14.

In one of the embodiments, taking the plurality of second fan-out wirings 52 located on a left side of the first region 131 as an example, the ends of the sixth segments 523 of 2, 3, or more than 3 of the second fan-out wirings 52 connected to the fifth segment 522 can all be located in the same inclined straight line L1, the ends of the sixth segment 523 of the other second fan-out wirings 52 connected to the fifth segments 522 can be not in the inclined straight line L1, but they only need to be located on the side of the signal bus region 13 away from the demultiplexing circuit region 14, which is also possible to prevent intersection with the signal trace 60 from appearing.

Furthermore, a distance between a side of the second fan-out wiring 52 and a same side of an adjacent second fan-out wiring 52 is greater than than a distance between a side of the first fan-out wiring 51 and a same side an adjacent first fan-out wiring 51.

In one of the embodiments, the distance between the side the second fan-out wiring 52 and the same side the second fan-out wiring 52 gradually decreases from the end away from the first portions 131 to the end close to the first portions 131.

As illustrated in FIG. 3, taking the fifth segment 522 of the second fan-out wiring 52 as an example, a distance b7 between a side of the fifth segment 522 and a same side of the fifth segment 522 of the adjacent second fan-out trace 52 in the first direction X is greater than the distance between a side of the second segment 512 in the first fan-out wiring 51 and a same side of the adjacent second segment 512, the distance b7 between the side of the fifth segment 522 and the same side of the fifth segment 522 of the adjacent second fan-out trace 52 in the first direction X gradually decreases from the side away from the first region 131 to the side close to the first region 131. In this way, by increasing the distance b7 between the same sides of the fifth segments 522 of the two adjacent second fan-out wirings 52 on the side away from the first region 131, intersection between the fifth segment 522 and the second portion 42 of the signal bus lines 40 is possible to prevent.

According to the display panel provided by the aforesaid embodiments of the present application, one embodiment of the present application further provides an electronic device. The electronic device includes the display panel of provided by the aforesaid embodiments. The electronic device can be a mobile terminal, e.g., a color electronic paper, a color e-book, a smart phone, etc., the electronic device can also be a wearable terminal, e.g., a smart watch, a smart bracelet, etc., and the electronic device can also be a fixed terminal, e.g., a color electronic billboard, a color electronic poster, etc.

Beneficial effects of the embodiments of the present application: The embodiments of the present application provide a display panel and an electronic device. The electronic device includes the display panel. The display panel includes a display region, a binding region defined on a side of the display region, and a signal bus line region located between the display region and the binding region. The display panel includes a driving chip disposed in the binding region, and a plurality of signal bus lines disposed in the signal bus line region. The plurality of signal bus lines extend along a first direction and are spaced apart in a second direction. The first direction is different from the second direction. The signal bus line region includes a first region defined aligned to the binding region and a second region located on two opposite sides of the first region. By reducing the distance between the sides away from each other of the first and the last of the signal bus lines in the first region, hereby, a width of a lower bezel of the display panel is reduced.

In summary, although the present application has disclosed the preferred embodiments as above, however the above-mentioned preferred embodiments are not to limit to the present application. A person skilled in the art can make any change and modification, therefore the scope of protection of the present application is subject to the scope defined by the claims.

What is claimed is:

1. A display panel, comprising a display region, a binding region defined on a side of the display region, and a signal bus line region located between the display region and the binding region, wherein the display panel comprises:
   a plurality of signal bus lines disposed in the signal bus line region, wherein the plurality of signal bus lines extend along a first direction and are spaced apart in a second direction, the first direction is different from the second direction; and
   wherein the signal bus line region comprises a first region defined aligned to the binding region and a second region located on two opposite sides of the first region, and a distance between sides away from each other of a first and a last of the plurality of signal bus lines in the first region is smaller than a distance between sides away from each other of a first and a last of the plurality of signal bus lines in the second region.

2. The display panel as claimed in claim 1, wherein the distance between the sides away from each other of the first and the last of the plurality of signal bus lines in the second region gradually decreases from an end away from the first region to an end close to the first region.

3. The display panel as claimed in claim 2, wherein the signal bus lines comprise first portions located in the first region and second portions located in the second region and connected to the first portions, a distance between a side of one of the first portions and a same side of an adjacent one of the first portions is less than a distance between a side of one of the second portions and a same side of an adjacent one of the second portions.

4. The display panel as claimed in claim 3, wherein the distance between the side of the one of the second portions and the same side of the adjacent one of the second portions gradually decreases from an end away from the first portions to an end close to the first portions.

5. The display panel as claimed in claim 4, wherein a width of the second portions in the second direction gradually decreases from the end away from the first portions to the end close to the first portions.

6. The display panel as claimed in claim 5, wherein distances between any two adjacent second portions are equal, and the distances between any two adjacent second portions are greater than or equal to distances between two adjacent first portions.

7. The display panel as claimed in claim 5, wherein a distance between any two adjacent second portions gradually decreases from the end away from the first portions to the end close to the first portions.

8. The display panel as claimed in claim 2, wherein the display panel comprises a demultiplexing circuit region, the demultiplexing circuit region is defined between the display region and the signal bus line region, and the display panel comprises:
   a plurality of first fan-out wirings comprising first segments led out from the binding region along the second direction, second segments connected to the first segments and extending along a direction different from the first direction and the second direction, and third segments connected to the second segments and extending to the demultiplexing circuit region through the first region along the second direction; and
   a plurality of second fan-out wirings comprising fourth segments led out from the binding region along the second direction, fifth segments connected to the fourth segments and extending along a direction different from the first direction and the second direction, and sixth segments connected to the fifth segments and extending to the demultiplexing circuit region through the second region along the second direction; and
   wherein an included angle between the second segments and the second direction is less than an included angle between the fifth segments and the second direction, and ends of the sixth segments connected to the fifth segments are located on a side of the signal bus line region away from the demultiplexing circuit region.

9. The display panel as claimed in claim 8, wherein the ends of the sixth segments of at least two of the plurality of second fan-out wirings located on any side of the first region and connected to the fifth segments are located in a same inclined straight line, and an extending direction of the inclined straight line is different from the first direction and the second direction.

10. The display panel as claimed in claim 9, wherein a distance between the ends of the sixth segments connected to the fifth segments and the demultiplexing circuit region gradually increases from the end close to the first region to the end away from the first region.

11. The display panel as claimed in claim 8, wherein a distance between a side of one of the plurality of second fan-out wirings and a same side of an adjacent one of the plurality of second fan-out wirings is greater than a distance between a side of one of the plurality of first fan-out wirings and a same side of an adjacent one of the plurality of first fan-out wirings.

12. The display panel as claimed in claim 11, wherein the distance between the side of the one of the plurality of second fan-out wirings and the same side of the adjacent one of the plurality of second fan-out wirings gradually decreases from the end away from the first portions to the end close to the first portions.

13. An electronic device, comprising a display panel, wherein the display panel comprises a display region, a binding region defined on a side of the display region, and a signal bus line region located between the display region and the binding region, and the display panel comprises:
   a plurality of signal bus lines disposed in the signal bus line region, wherein the plurality of signal bus lines extend along a first direction and are spaced apart in a second direction, the first direction is different from the second direction; and
   wherein the signal bus line region comprises a first region defined aligned to the binding region and a second region located on two opposite sides of the first region, and a distance between sides away from each other of a first and a last of the plurality of signal bus lines in the first region is smaller than a distance between sides away from each other of a first and a last of the plurality of signal bus lines in the second region.

14. The electronic device as claimed in claim 13, wherein the distance between the sides away from each other of the first and the last of the plurality of signal bus lines in the second region gradually decreases from an end away from the first region to an end close to the first region.

15. The electronic device as claimed in claim 14, wherein the signal bus lines comprise first portions located in the first region and second portions located in the second region and connected to the first portions, a distance between a side of one of the first portions and a same side of an adjacent one of the first portions is less than a distance between a side of one of the second portions and a same side of an adjacent one of the second portions.

16. The electronic device as claimed in claim 15, wherein the distance between the side of the one of the second portions and the same side of the adjacent one of the second portions gradually decreases from an end away from the first portions to an end close to the first portions.

17. The electronic device as claimed in claim 16, wherein a width of the second portions in the second direction gradually decreases from the end away from the first portions to the end close to the first portions.

18. The electronic device as claimed in claim 17, wherein distances between any two adjacent second portions are equal, and the distances between any two adjacent second portions are greater than or equal to distances between two adjacent first portions.

19. The electronic device as claimed in claim 17, wherein a distance between any two adjacent second portions gradually decreases from the end away from the first portions to the end close to the first portions.

20. The electronic device as claimed in claim 14, wherein the display panel comprises a demultiplexing circuit region, the demultiplexing circuit region is defined between the display region and the signal bus line region, and the display panel comprises:
   a plurality of first fan-out wirings comprising first segments led out from the binding region along the second direction, second segments connected to the first segments and extending along a direction different from the first direction and the second direction, and third segments connected to the second segments and extending to the demultiplexing circuit region through the first region along the second direction; and
   a plurality of second fan-out wirings comprising fourth segments led out from the binding region along the second direction, fifth segments connected to the fourth segments and extending along a direction different from the first direction and the second direction, and sixth segments connected to the fifth segments and extending to the demultiplexing circuit region through the second region along the second direction; and
   wherein an included angle between the second segments and the second direction is less than an included angle between the fifth segments and the second direction, and ends of the sixth segments connected to the fifth segments are located on a side of the signal bus line region away from the demultiplexing circuit region.

* * * * *